(12) United States Patent
    Adachi

(10) Patent No.: US 10,135,429 B2
(45) Date of Patent: Nov. 20, 2018

(54) CLOCK CORRECTION DEVICE AND CLOCK CORRECTING METHOD

(71) Applicant: MegaChips Corporation, Osaka (JP)

(72) Inventor: Shingo Adachi, Chiba (JP)

(73) Assignee: MegaChips Corporation, Osaka (JP)

( * ) Notice: Subject to any disclaimer, the term of this patent is extended or adjusted under 35 U.S.C. 154(b) by 0 days.

(21) Appl. No.: 15/465,783

(22) Filed: Mar. 22, 2017

(65) Prior Publication Data

US 2017/0279441 A1    Sep. 28, 2017

(30) Foreign Application Priority Data

Mar. 24, 2016    (JP) .................................. 2016-060142

(51) Int. Cl.
    *H03K 3/017*    (2006.01)
    *H03K 5/04*     (2006.01)
    *H03K 7/08*     (2006.01)
    *H03K 5/156*    (2006.01)

(52) U.S. Cl.
    CPC .................................. *H03K 5/1565* (2013.01)

(58) Field of Classification Search
    CPC .................................................... H03K 5/1565
    USPC ........................................................ 327/157
    See application file for complete search history.

(56) References Cited

U.S. PATENT DOCUMENTS

| 7,840,831 B2 * | 11/2010 | Jang ....................... H03K 5/135 327/175 |
| 8,072,253 B2 | 12/2011 | Kaeriyama et al. |
| 2003/0063701 A1 * | 4/2003 | Eubanks ................... H03L 7/07 375/376 |

FOREIGN PATENT DOCUMENTS

| JP | 2009-044579 A | 2/2009 |
| WO | 2008/032701 A1 | 3/2008 |

* cited by examiner

*Primary Examiner* — Lincoln Donovan
*Assistant Examiner* — Metasebia Retebo
(74) *Attorney, Agent, or Firm* — Osha Liang LLP

(57) ABSTRACT

A clock correction device performs skew adjustment and duty correction of an input clock concurrently or in parallel. The clock correction device includes a correction circuit that performs skew adjustment of an input clock by analog control using a skew adjustment signal based on a phase difference between an output clock and a reference clock, receives a duty control signal, and performs duty correction of the input clock by digital control, a skew detection circuit that receives inputs of the output clock and the reference clock and, when only the reference clock is in a predetermined state, outputs a detection signal that changes to the predetermined state, an integration circuit that integrates the detection signal and generates a first voltage signal, and a comparator that compares the first voltage signal and a first reference signal to thereby generate the skew adjustment signal.

6 Claims, 18 Drawing Sheets

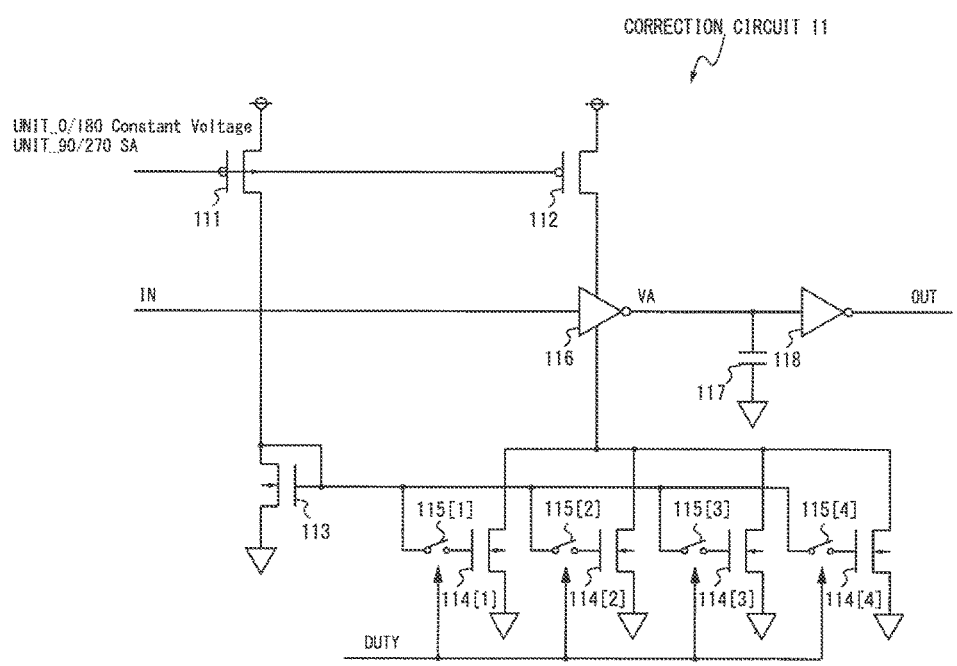

CLOCK CORRECTION DEVICE AND CLOCK CORRECTING METHOD

BACKGROUND OF THE INVENTION

Field of the Invention

The present invention generally relates to a clock correction device and method and, more particularly, to a clock correction device and a clock correction method for adjusting skew and duty of multiphase clocks.

Description of the Related Art

In recent years, an amount of communication data in the communication field such as a PON (Passive Optical Network) and a timing controller has been continuing to increase. Therefore, a further increase in speed is demanded for semiconductor integrated circuits used in the field. In such semiconductor integrated circuits, in multiphase clocks, compared with a single-phase clock, clock skew (a difference between times of arrival of a clock to nodes of the semiconductor integrated circuit; sometimes called timing skew; hereinafter referred to as "skew") often occurs; however, since increase in speed and wiring distribution in the single-phase clock is difficult, a method of lowering a frequency of the clock and converting a single phase thereof into multiple phases to thereby speed up timing of change of the clock has widely been used.

As the semiconductor integrated circuit in which the multiphase clocks are used, typically, there is a semiconductor integrated circuit that generates multiphase clocks such as four-phase clocks in a transmitting device and distributes the generated multiphase clocks to respective receiving devices by using a clock distribution circuit (CLK Distribution).

In phases among clocks included in the multiphase clocks, a shift often occurs because of a mismatch of elements used in the receiving devices and the like and insufficiency of a bandwidth during the distribution of the multiphase clocks. In particular, when high-speed multiphase clocks are distributed to the receiving devices by using the clock distribution circuit, it is difficult to avoid occurrence of a phase shift among clocks.

When the multiphase clocks are input to a phase interpolator, which performs interpolation of phases, while the phase shift among clocks included in the multiphase clocks remains occurring, jitter tolerance is deteriorated. This is because, in the phase interpolator, a shift of the phases among the clocks included in the multiphase clocks corresponds to jitter. In a field in which jitter specifications such as PON are strict, the deterioration in the jitter tolerance is a serious problem.

Therefore, it is considered important to perform correction of the phase shift of the multiphase clocks generally called skew adjustment.

In the semiconductor integrated circuit discussed above, duty of each clock included in the multiphase clocks also needs to be accurate. This is because, when the duty is inappropriate, the duty affects operation of the semiconductor integrated circuit. Therefore, it is also important to perform duty correction in addition to the skew adjustment.

Japanese Patent Publication No. 2009-44579 (Patent Document 1) discloses a clock generation circuit comprising a skew adjustment circuit that receives a first clock and generates a second clock subjected to skew adjustment, and a DLL (Delay Locked Loop) circuit that receives the second clock and generates multiphase clocks with a clock delay time locked.

WO 2008/032701 (Patent Document 2) discloses a clock adjustment circuit that performs skew adjustment and duty correction of multiphase clocks. In the clock adjustment circuit, skew adjustment and duty correction are performed by way of digital correction.

The clock generation circuit disclosed in Patent Document 1 described above includes the skew adjustment circuit. However, since the skew adjustment circuit performs the skew adjustment during the generation of the multiphase clocks, a phase shift caused in the multiphase clocks cannot be corrected by the clock generation circuit. Further, since the clock generation circuit does not include a duty correction function, the clock generation circuit cannot perform duty correction.

The clock adjustment circuit disclosed in Patent Document 2 described above can perform the duty correction in addition to the skew adjustment. However, since both of the skew adjustment and the duty correction are digitally processed, there is a problem that a phase shift is caused again when the duty correction is performed after the skew adjustment.

SUMMARY

Therefore, an object of the present invention is to provide a clock correction device and a clock correction method for performing skew adjustment and duty correction of multiphase clocks, the clock correction device and the clock correction method being capable of performing the skew adjustment of the multiphase clocks without being affected by the duty correction.

The present invention for solving the problems may include matters to define the invention or technical features explained below.

That is, an invention according to an aspect may be a clock correction device capable of performing skew adjustment and duty correction of an input clock and outputting the input clock as an output clock. The clock correction device may comprise: a correction circuit that performs skew adjustment of an input clock under analog control using a skew adjustment signal based on a phase difference between an output clock and a reference clock, receives a duty control signal, and performs duty correction of the input clock by digital control; a skew detection circuit that outputs, when the output clock and the reference clock are input and only the reference clock is in a predetermined state (e.g., "H"), a detection signal that is in the predetermined state (e.g., "H"); an integration circuit that integrates the detection signal and generates a first voltage signal; and a comparator that compares the first voltage signal and a first reference signal and generates the skew adjustment signal on the basis of a result of the comparison.

The clock correction device may include a wrapper circuit. The integration circuit may integrate the output clock and generate a second voltage signal instead of the detection signal based on an instruction from the wrapper circuit. The comparator may compare the second voltage signal and a second reference signal instead of comparing the first voltage signal and the first reference signal and generate a correction completion signal. The wrapper circuit may change a value of the duty control signal until the correction completion signal reaches a predetermined value.

An invention according to an aspect may be a multiphase clock correction device that performs skew adjustment and duty correction of multiphase clocks having a predetermined phase difference from one another. The multiphase clock correction device may comprise a plurality of correction circuits operably connected in multiple stages. Each of the correction circuits may perform skew adjustment of an input clock under analog control using a skew adjustment signal based on a phase difference between an output clock and a reference clock, receive a duty control signal, and performs duty correction of the input clock under digital control. Further, the multiphase clock correction device may comprise a skew detection circuit that outputs, the output clock of one correction circuit among the correction circuits and the output clock, regarded as the reference clock, of the correction circuit at a preceding-stage of the one correction circuit are input and only the reference clock is in a predetermined state (e.g., "H"), a detection signal that is in the predetermined state (e.g., "H"); an integration circuit that integrates the detection signal and generates a first voltage signal; and a comparator that compares the first voltage signal and a first reference signal and generates the skew adjustment signal of the one correction circuit.

The multiphase clock correction device may further comprise a wrapper circuit. The integration circuit may integrate the output clock of the correction circuit at a predetermined stage among the correction circuits and generate a second voltage signal instead of the detection signal based on an instruction from the wrapper circuit. The comparator may compare the second voltage signal and a second reference signal instead of comparing the first voltage signal and the first reference signal and generate a correction completion signal of the correction circuit at the predetermined stage. The wrapper circuit may change a value of the duty control signal of the correction circuit at the predetermined stage until the correction completion signal of the correction circuit at the predetermined stage reaches a predetermined value.

An invention according to an aspect may be directed to a clock correction method for multiphase clocks in a multiphase clock correction circuit including a plurality of correction circuits connected in multiple stages. The method may include: adjusting skew of an input clock under analog control using a skew adjustment signal based on a phase difference between an output clock and a reference clock; and receiving a duty control signal and correction duty of the input clock by digital control. The adjusting the skew may include: outputting, when the output clock of one correction circuit among the correction circuits and the output clock, regarded as the reference clock, of the correction circuit at a preceding-stage of the one correction circuit are input and only the reference clock is in a predetermined state (e.g., "H"), a detection signal that changes to the predetermined state (e.g., "H"); integrating the detection signal and generating a first voltage signal; and comparing the first voltage signal and a first reference signal and generating a skew adjustment signal of the one correction circuit.

The correcting the duty may include: integrating the output clock of the correction circuit at a predetermined stage among the correction circuits and generating a second voltage signal; comparing the second voltage signal and a second reference signal and generating a correction completion signal of the correction circuit at the predetermined stage; and changing a value of the duty control signal of the correction circuit at the predetermined stage until the correction completion signal of the correction circuit at the predetermined stage reaches a predetermined value.

According to the present invention, the clock correction device and the clock correction method may be able to perform skew adjustment of multiphase clocks without being affected by duty correction.

Other technical features, objects, and action and effect or advantages of the present invention will be clarified by embodiments explained below with reference to the accompanying drawings.

BRIEF DESCRIPTION OF THE DRAWINGS

FIG. 3 is a circuit diagram for illustrating a correction circuit included in a correction processing circuit of a multiphase clock correction device according to an embodiment of the invention;

DETAILED DESCRIPTION OF THE PREFERRED EMBODIMENTS

Figure 1:
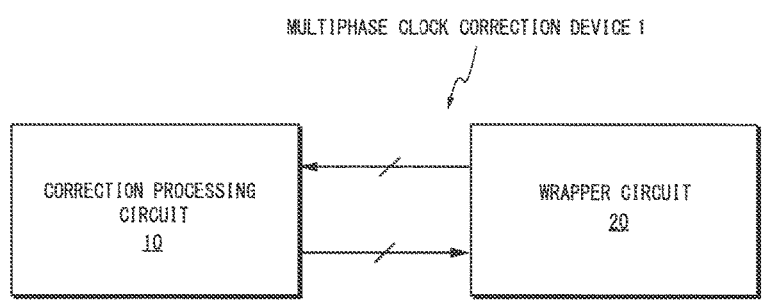
FIG. 1 is a block diagram for illustrating a multiphase clock correction device according to an embodiment of the invention.

Embodiments of the present invention are explained below with referenced to the drawings. The embodiments explained below are only illustrations and does not mean to exclude application of various modifications and techniques not clearly explained below. The present invention can be variously modified (e.g., combining embodiments) and carried out without departing from the spirit of the present invention. In the description of the drawings referred to below, same or similar portions may be denoted by same or similar references. The drawings may be schematic and may not always coincide with actual dimensions, ratios, and the like. Portions having different relations of dimensions and different ratios may be included in the drawings.

FIG. 1 is a block diagram showing an example of a multiphase clock correction device according to one embodiment of the invention. As shown in the figure, a multiphase clock correction device 1 may include a correction processing circuit 10 and a wrapper circuit 20 operably connected to the correction processing circuit 10.

The correction processing circuit 10 may perform correction of skew among clocks CLK forming multiphase clocks and duty of the clocks CLK concurrently or in parallel and output the corrected multiphase clocks. Further, the correction processing circuit 10 may output a correction completion signal to the wrapper circuit 20. In this example, the correction processing circuit 10 may be configured by known elements. Details are explained below.

The wrapper circuit 20 may receive the correction completion signal output from the correction processing circuit 10 and perform predetermined processing. The wrapper circuit 20 may be typically an interface circuit but not limited to this. In this example, the wrapper circuit 20 may include a control circuit for controlling operation of the correction processing circuit 10. The wrapper circuit 20 may be a digital circuit configured by known digital elements.

Figure 2:
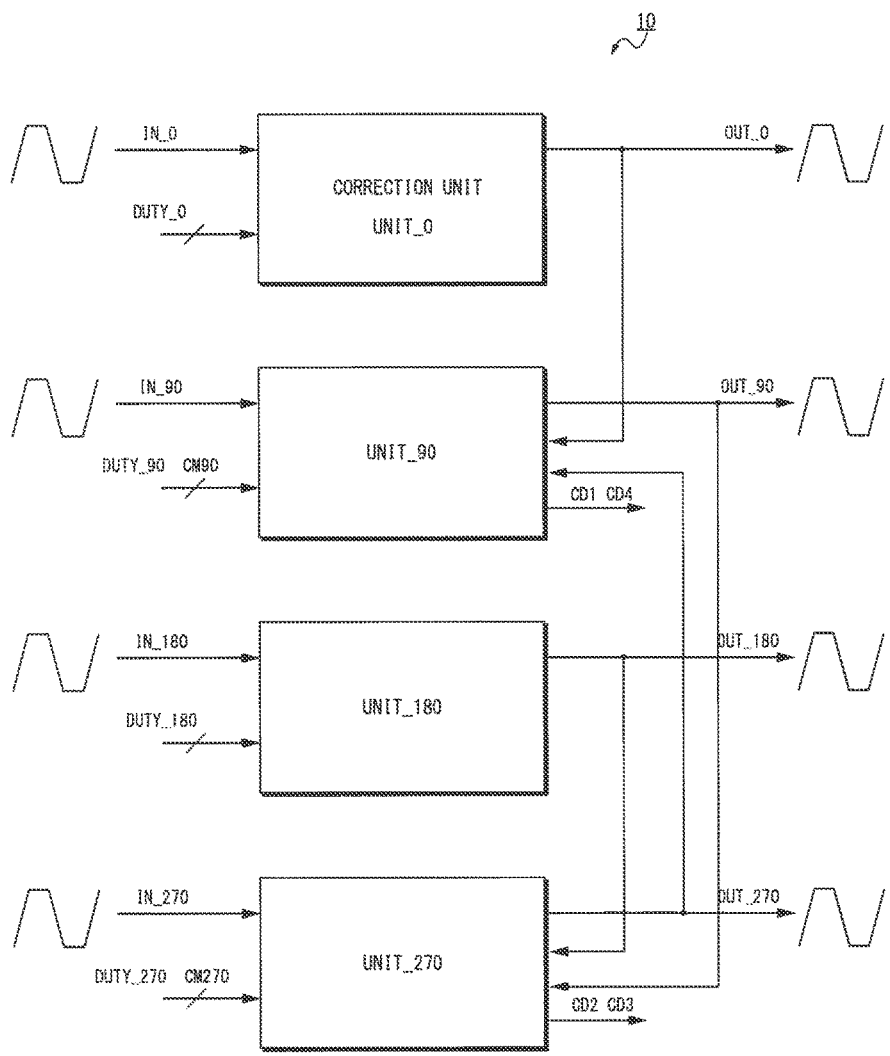
FIG. 2 is a block diagram for illustrating a correction processing circuit included in a multiphase clock correction device according to an embodiment of the invention.

FIG. 2 is a block diagram showing an example of the correction processing circuit of the multiphase clock correction device according to one embodiment of the invention. As shown in the figure, the correction processing circuit 10 may include, for example, correction units UNIT_0, UNIT_90, UNIT_180, and UNIT_270, which are operably connected in multiple stages. It is noted that, in the following explanation, multiple clocks may be configured by four clocks CLK of clocks CLK_0, CLK_90, CLK_180, and CLK_270.

The correction unit UNIT_0 may perform duty correction of the clock CLK_0. Specifically, the correction unit UNIT_0 may receive an input clock IN_0, which is the clock CLK_0 before the correction, and output an output clock OUT_0, which is the clock CLK_0 after the duty correction. The correction unit UNIT_0 may receive, from the wrapper circuit 20, a duty control signal DUTY_0 for correcting duty of the input clock IN_0.

The correction unit UNIT_90 may perform skew adjustment and duty correction of the clock CLK_90. Specifically, the correction unit UNIT_90 may receive an input clock IN_90, which is the clock CLK_90 before the correction, and output an output clock OUT_90, which is the clock CLK_90 after the skew adjustment and the duty correction. The correction unit UNIT_90 may receive the output clock OUT_0 from the correction unit UNIT_0 and receive an output clock OUT_270 from the correction unit UNIT_270. Further, the correction unit UNIT_90 may receive, from the wrapper circuit 20, a duty control signal DUTY_90 for correcting duty of the input clock IN_90 and a comparison mode signal CM90 for switching an operation mode of the correction unit UNIT_90. The correction unit UNIT_90 may output, to the wrapper circuit 20, a correction completion signal CD1 for notifying duty correction completion of the clock CLK_0 and a correction completion signal CD4 for notifying duty correction completion of the clock CLK_270.

The correction unit UNIT_180 may perform duty correction of the clock CLK_180. That is, the correction unit UNIT_180 may receive an input clock IN_180, which is the clock CLK_180 before the correction and output an output clock OUT_180, which is the clock CLK_180 after the duty correction. The correction unit UNIT_180 may receive, from the wrapper circuit 20, a duty control signal DUTY_180 for correcting duty of the input clock IN_180.

The correction unit UNIT_270 may perform skew adjustment and duty correction of the clock CLK_270. Specifically, the correction unit UNIT_270 may receive an input clock IN_270, which is the clock CLK_270 before the correction, and output the output clock OUT_270, which is the dock CLK_270 after the skew adjustment and the duty correction. The correction unit UNIT_270 may receive the output clock OUT_90 from the correction unit UNIT_90 and receive the output clock OUT_180 from the correction unit UNIT_180. Further, the correction unit UNIT_270 may receive, from the wrapper circuit 20, a duty control signal DUTY_270 for correction duty of the input clock IN_270 and a comparison mode signal CM270 for switching an operation mode of the correction unit UNIT_270. The correction unit UNIT_270 may output, to the wrapper circuit 20, a correction completion signal CD2 for notifying duty correction completion of the clock CLK_180 and a correction completion signal CD3 for notifying duty correction completion of the clock CLK_90.

FIG. 3 is a circuit diagram showing an example of a correction circuit included in the correction processing circuit of the multiphase clock correction device according to one embodiment of the invention. As shown in the figure, a correction circuit 11 may include a transistor 111, a transistor 112, a transistor 113, a plurality of transistors 114, a plurality of switches 115, an inverter 116, a capacitor 117, and an inverter 118. It is noted that the correction circuit 11 may be provided in each of the correction units UNIT_0, UNIT_90, UNIT_180, and UNIT_270.

The transistor 111 may be, for example, a P-channel MOSFET. A gate terminal of the transistor 111 may operably be connected to a gate terminal of the transistor 112, a source terminal of the transistor 111 may operably be connected to a power supply, and a drain terminal of the transistor 111 may operably be connected to a drain terminal and a gate terminal of the transistor 113. The gate terminals of the transistors 111 of the correction units UNIT_0 and UNIT_180 may receive a predetermined constant voltage signal. On the other hand, the gate terminals of the transistors 111 of the correction units UNIT_90 and UNIT_270 may receive a skew adjustment signal SA.

The transistor 112 may be, for example, a P-channel MOSFET. A source terminal of the transistor 112 may operably be connected to the power supply and a drain terminal of the transistor 112 may operably be connected to the inverter 116. The gate terminal of the transistor 112 may operably be connected to the gate terminal of the transistor 111 as explained above. Accordingly, the gate terminals of the transistors 112 may receive the predetermined constant voltage signal in the correction units UNIT_0 and UNIT_180 and receive the skew adjustment signal SA in the correction units UNIT_90 and UNIT_270. By way of this, the transistor 112 may output, to the inverter 116, as a power supply current, an electric current flowing to the drain terminal according to the predetermined constant voltage signal or the skew adjustment signal SA received by the gate terminal.

The transistor 113 may be, for example, an N-channel MOSFET. The gate terminal of the transistor 113 may operably be connected to gate terminals of the transistors 114 via the switches 115 and a source terminal of the transistor 113 may be grounded. The drain terminal and the gate terminal of the transistor 113 may operably be connected to the drain terminal of the transistor 111 as explained above. Thus, the drain terminal and the gate terminal of the transistor 113 may receive an electric current flowing to the drain terminal of the transistor 111 according to the predetermined constant voltage signal or the skew adjustment signal SA received by the gate terminal of the transistor 111.

The transistors 114 may be able to be provided by a predetermined number in order to change a value of the electric current output to the inverter 116 as the power supply current. In this example, as shown in the figure, four transistors 114[1] to 114[4] are provided. The transistors 114 may be, for example, N-channel MOSFET. Drain terminals of the transistors 114 may operably be connected to the inverter 116 and source terminals of the transistors 114 may be grounded. The gate terminals of the transistors 114 may operably be connected to the gate terminal of the transistor 113 via the switches 115 as explained above. By way of this, the transistors 114 may configure a current mirror circuit of a multistage type in conjunction with the transistor 113. Therefore, the transistors 114 may multiply, according to the number of the operating transistors 114, a value of the electric current flowing to the drain terminal of the transistor 113 and output the electric current from the drain terminals to the inverter 116 as the power supply current.

The switches 115 may be provided to correspond to the transistors 114. In this example, four switches 115[1] to 115[4] may be provided. The switches 115 may operably be connected between the gate terminal of the transistor 113 and the gate terminals of the transistors 114 corresponding to the switches 115, respectively. The switches 115 may operate the transistors 114 corresponding to the switches 115 by being turned on. It is noted that the switches 115 may be controlled to be turned on according to a duty control signal DUTY from the wrapper circuit 20.

The inverters 116 may receive an input clock IN, change and invert a waveform of the input clock IN according to values of the electric currents received as the power supply current from the transistor 112 and the transistors 114, and generate and output an internal adjusted waveform VA.

The inverter 118 may receive the internal adjusted waveform VA, a rising time of which is adjusted from the electric current flowing to the transistors 112 and 114 in the capacitor 117, and output an output clock OUT generated by inverting the internal adjusted waveform VA.

Figure 4A:
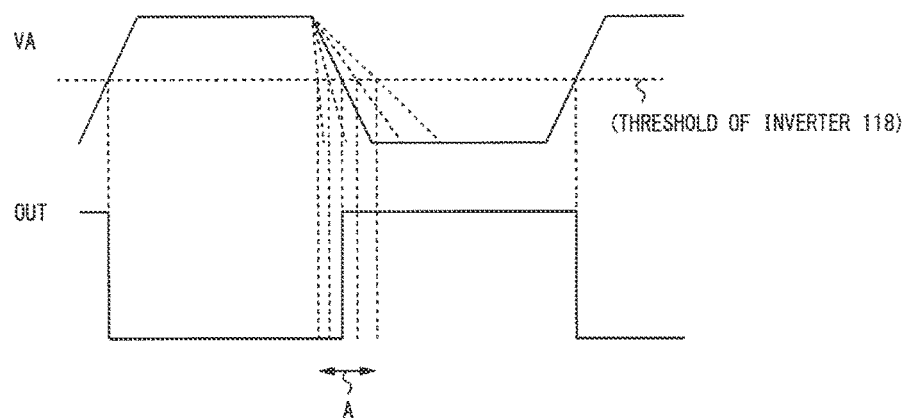
FIG. 4A is a waveform chart for illustrating duty correction of clocks CLK in a multiphase clock correction device according to an embodiment of the invention.

FIG. 4A is a waveform chart for illustrating duty correction of the clock CLK in the multiphase clock correction device according to the embodiment of the present invention. That is, the figure indicates the internal adjusted waveform VA output from the inverter 116 and a waveform of the output clock OUT output from the inverter 118 in the correction circuit 11.

Skew of a falling edge of the internal adjusted waveform VA may change as indicated by an arrow A according to a value of the electric current received by the inverter 116 as the power supply current from the transistors 114. It is noted that the value of the electric current may change according to the number of the operating transistors 114 as explained above.

Duty of the output clock OUT may change in accordance with the change of the skew of the falling edge of the internal adjusted waveform VA. This may be because the output clock OUT output by the inverter 118 changes to "L" when the potential of the internal adjusted waveform VA is potential equal to or larger than a threshold shown in the figure and change to "H" when the potential of the internal adjusted waveform VA is potential smaller than the threshold. In this way, the correction circuit 11 may be able to perform the duty correction of the clock CLK.

Figure 4B:
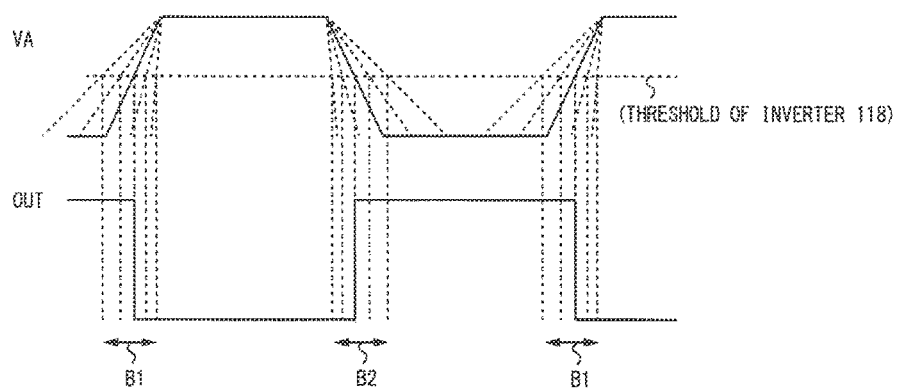
FIG. 4B is a waveform chart for illustrating skew adjustment among clocks CLK in a multiphase clock correction device according to an embodiment of the invention.

FIG. 4B is a waveform chart for explaining skew adjustment among the clocks CLK in the multiphase clock correction device according to one embodiment of the invention. As in the case of FIG. 4A, the figure shows the internal adjusted waveform VA output from the inverter 116 and the waveform of the output clock OUT output from the inverter 118 in the correction circuit 11. It is noted that the figure shows a waveform chart in the case in which the gate terminal of the transistor 111 receives the skew adjustment signal SA, namely, in the correction units UNIT_90 and UNIT_270.

Skews of a rising edge and a falling edge of the internal adjusted waveform VA may simultaneously change as indicated by arrows B1 and B2 when values of the electric currents received as the power supply current by the inverter 116 from the transistor 112 and the transistors 114 are simultaneously changed. It is noted that the values of the electric currents received as the power supply current from the transistor 112 and the transistors 114 may simultaneously change when the skew adjustment signal SA is changed.

A phase of the output clock OUT may change when the rising edge and the falling edge of the internal adjusted waveform VA simultaneously change. This may be because the output clock OUT output by the inverter 118 changes to "L" when the potential of the internal adjusted waveform VA is potential equal to or larger than a threshold shown in the figure and changes to "H" when the potential of the internal adjusted waveform VA is potential smaller than the threshold as explained above. In this way, the multiphase clock correction device 1 may be able to perform the skew adjustment among the clocks CLK.

Figure 5A:
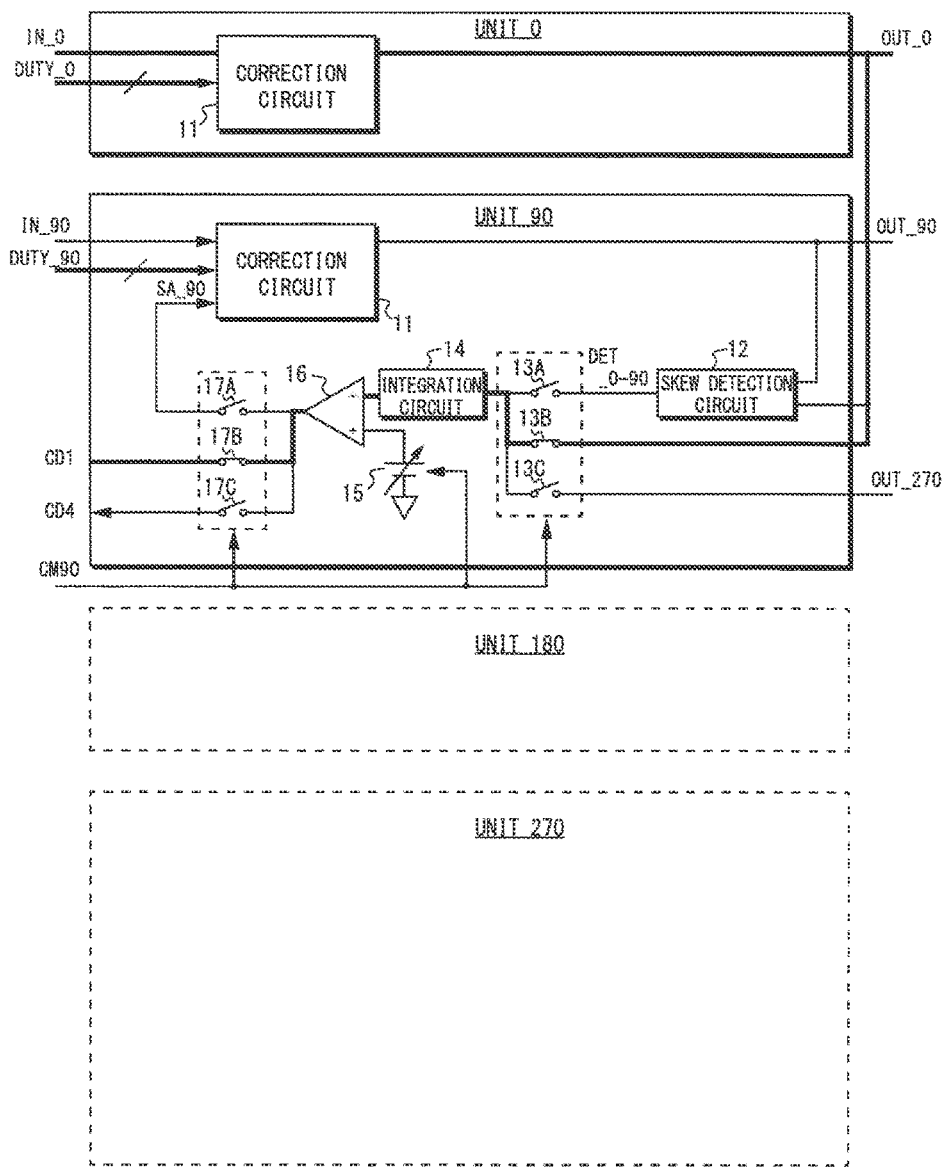
FIG. 5A is a block diagram for illustrating duty correction of a clock CLK_0 in a multiphase clock correction device according to an embodiment of the invention.

FIG. 5A is a diagram for explaining the duty correction of the clock CLK_0 in the multiphase clock correction device according to one embodiment of the invention. In the figure, for convenience, a configurations of only the correction units UNIT_0 and UNIT_90 are shown.

The correction unit UNIT_0 may include, for example, the correction circuit 11. The correction circuit 11 may receive an input clock IN_0 and a duty control signal DUTY_0, correct duty of the input clock output the input clock IN_0 as the output clock OUT_0.

On the other hand, the correction unit UNIT_90 may include, for example, the correction circuit 11, a skew detection circuit 12, a switch 13, an integration circuit 14, a variable power supply 15, a comparator 16, and a switch 17.

The correction circuit 11 may receive an input clock IN_90, a duty control signal DUTY_90, and a skew adjustment signal SA_90, correct duty of the input clock IN_90 and perform skew adjustment, and output the input clock IN_90 as the output clock OUT_90.

Figure 6:
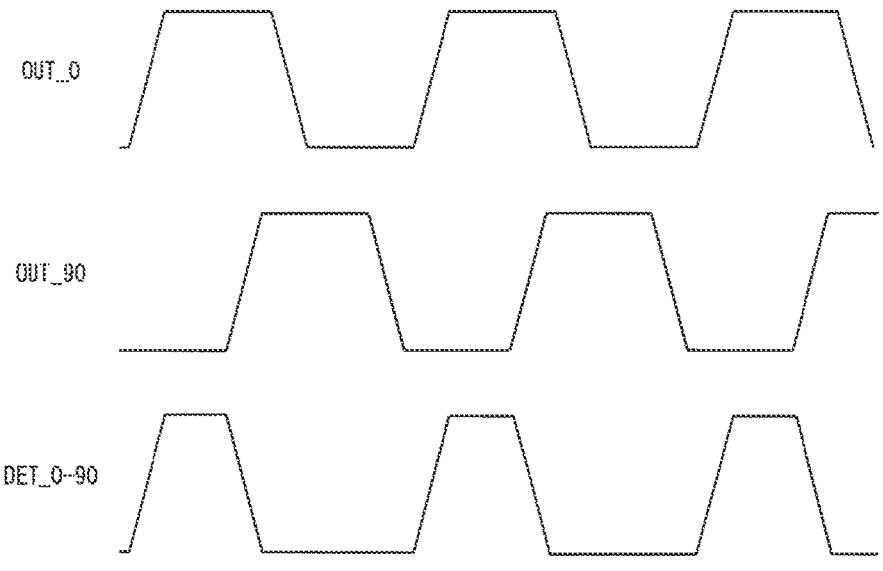
FIG. 6 is a diagram for illustrating operation of a skew detection circuit included in a correction processing circuit of a multiphase clock correction device according to an embodiment of the invention.

The skew detection circuit 12 may receive the output clock OUT_0 and the output clock OUT_90 and output a detection signal DET_0-90. It is noted that the detection signal DET_0-90 may be generated by a logic circuit shown in FIG. 6 and, for example, change to "H" when only the output clock OUT_0 is "H" and change to "L" otherwise.

Referring back to FIG. 5A, the switch 13 may include, for example, a switch 13A, a switch 13B, and a switch 13C. In the switch 13, any one of the switches may be turned on based on the content of the comparison mode signal CM90 from the wrapper circuit 20. Specifically, when the comparison mode signal CM90 may instruct the correction unit UNIT_90 to operate in a normal mode, since the switch 13A may be turned on, the integration circuit 14 may receive the detection signal DET_0-90 from the skew detection circuit 12. When the comparison mode signal CM90 may instruct the correction unit UNIT_90 to operate in a comparison mode and instructs duty correction for the clock CLK_0, since the switch 13B may be turned on, the integration circuit 14 may receive the output clock OUT_0. Further, when the comparison mode signal CM90 may instruct the correction unit UNIT_90 to operate in the comparison mode and instruct duty correction for the clock CLK_270, since the switch 13C may be turned on, the integration circuit 14 may receive the output clock OUT_270.

The integration circuit 14 may integrate an input signal, create a smoothed voltage signal, and output the voltage signal to a '−' (negative) input terminal of the comparator 16.

When the comparison mode signal CM90 may instruct the correction unit UNIT_90 to operate in the normal mode, the variable power supply 15 may generate a first reference signal and output the first reference signal to a '+' (positive) input terminal of the comparator 16. On the other hand, when the comparison mode signal CM90 may instruct the correction unit UNIT_90 to operate in the comparison mode, the variable power supply 15 may generate a second reference signal and output the second reference signal to the '+' input terminal of the comparator 16.

The comparator 16 may compare the voltage signal supplied from the integration circuit 14 and the first reference signal or the second reference signal supplied from the variable power supply 15 and output a result of the comparison made.

The switch 17 may include, for example, a switch 17A, a switch 17B, and a switch 17C. In the switch 17, any one of the switches may be turned on based on the content of the comparison mode signal CM90 from the wrapper circuit 20. Specifically, when the comparison mode signal CM90 may instruct the correction unit UNIT_90 to operate in the normal mode, since the switch 17A may be turned on, the comparator 16 may output the skew adjustment signal SA_90 to the correction circuit 11. When the comparison mode signal CM90 may instruct the correction unit UNIT_90 to operate in the comparison mode and instruct duty correction for the clock CLK_0, since the switch 17B may be turned on, the comparator 16 may output the correction completion signal CD1 to the wrapper circuit 20. Further, when the comparison mode signal CM90 may instruct the correction unit UNIT_90 to operate in the comparison mode and instruct duty correction for the clock CLK_270, since the switch 17C may be turned on, the comparator 16 may output the correction completion signal CD4 to the wrapper circuit 20.

In the duty correction of the clock performed using the correction units UNIT_0 and UNIT_90 configured as explained above, the comparison mode signal CM90 for instructing the correction unit UNIT_90 to operate in the comparison mode and instructing the duty correction for the clock CLK_0 may be output from the wrapper circuit 20 to the correction unit UNIT_90. Thus, the switch 13B may be turned on in the switch 13 and the switch 17B may be turned on in the switch 17. The variable power supply 15 may generate second reference signal and output the second reference potential to the '+' input terminal of the comparator 16.

As discussed above, the integration circuit 14 of the correction unit UNIT_90 may receive the output clock OUT_0, integrate the output clock OUT_0 and generate a voltage signal smoothed, and output the voltage signal to the '−' input terminal of the comparator 16.

Setting values of the duties of the clocks CLK may be set to 50%. In this case, if the output clock OUT_0 is exactly the setting value, the potential of the voltage signal generated by the integration circuit 14 may be ½vdd (vdd is a power supply voltage). Thus, the second reference signal generated by the variable power supply 15 may be set to ½vdd. Comparison of the voltage signal generated by the integration circuit 14 and the second reference signal may be performed in the comparator 16.

While such comparison may be performed in the comparator 16, the wrapper circuit 20 may digitally convert a value of the duty control signal DUTY_0 output to the correction circuit 11 of the correction unit UNIT_0. Thus, since the number of operating transistors 114 among the plurality of transistors 114 shown in FIG. 3 may change, the value of the electric current received as the power supply current by the inverter 116 from the drain terminal of the transistor 114 may change. That is, the value of the electric current may change according to digital control by the wrapper circuit 20 using the duty control signal DUTY_0.

The duty of the output clock OUT_0 may change as explained with reference to FIG. 4A when the value of the electric current received as the power supply current by the inverter 116 from the drain terminals of the transistors 114 is changed. While the duty of the output clock OUT_0 may be changed, when the duty of the output clock OUT_0 may reach the setting value of 50%, the voltage signal generated by the integration circuit 14 may be ½vdd. Therefore, in the comparator 16, the voltage signal from the integration circuit 14 and the second reference signal may coincide with each other. The comparator 16 may output the correction completion signal CD1 indicating that the duty correction of the clock CLK_0 is completed to the wrapper circuit 20. Thus, the wrapper circuit 20 may fix a value of the duty control signal DUTY_0, output the duty control signal DUTY_0 to the correction circuit 11 of the correction unit UNIT_0, and maintain the duty of the output clock OUT_0 at 50%. Consequently, the duty correction of the clock CLK_0 using the digital control may be completed.

Figure 5B:
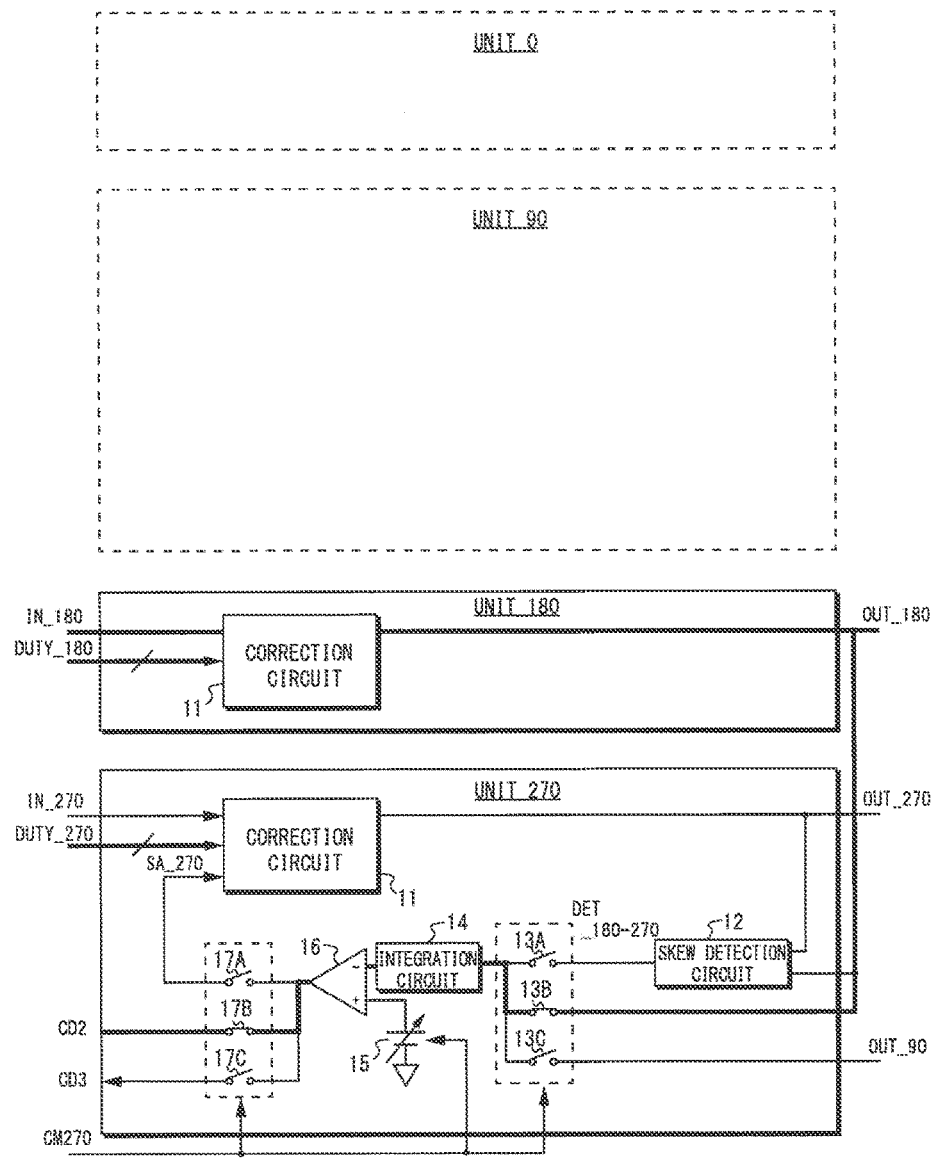
FIG. 5B is a block diagram for illustrating duty correction of a clock CLK_180 in a multiphase clock correction device according to an embodiment of the invention.

FIG. 5B is a diagram for illustrating a duty correction example of the clock CLK_180 in the multiphase clock correction device according to one embodiment of the invention. In the figure, for convenience, the configurations of only the correction units UNIT_180 and UNIT_270 are shown.

The correction unit UNIT_180 may include the configuration same as, or equivalent to, the configuration of the correction unit UNIT_0 and include the correction circuit 11. The correction circuit 11 may receive the input clock IN_180 and the duty control signal DUTY_180, correct duty of the input clock IN_180, and output the input clock IN_180 as the output clock OUT_180.

The correction unit UNIT_270 may include the configuration same as, or equivalent to, the configuration of the correction unit UNIT_90 and thus include, for example, the correction circuit 11, the skew detection circuit 12, the switch 13, the integration circuit 14, the variable power supply 15, the comparator 16, and the switch 17.

The correction circuit 11 may receive the input clock IN_270, the duty control signal DUTY_270, and a skew adjustment signal SA_270, correct duty of the input clock IN_270 and perform skew adjustment, and output the input clock IN_270 as the output clock OUT_270.

The skew detection circuit 12 may receive the output clock OUT_180 and the output clock OUT_270 and output a detection signal DET_180-270. It is noted that the detection signal DET_180-270 may be "H" when only the output clock OUT_180 is "H" and may be "L" otherwise.

In the switch 13, any one of the switches may be turned on based on the content of the comparison mode signal CM270 from the wrapper circuit 20. Specifically, when the comparison mode signal CM270 from the wrapper circuit 20 may instruct the correction unit UNIT_270 to operate in the normal mode, since the switch 13A may be turned on, the integration circuit 14 may receive the detection signal DET_180-270 from the skew detection circuit 12. When the comparison mode signal CM270 may instruct the correction unit UNIT_270 to operate in the comparison mode and instruct duty correction for the clock CLK_180, since the switch 13B may be turned on, the integration circuit 14 may receive the output clock OUT_180. Further, when the comparison mode signal CM270 may instruct the correction unit UNIT_270 to operate in the comparison mode and instruct duty correction for the clock CLK_90, since the switch 13C may be turned on, the integration circuit 14 may receive the output clock OUT_90.

When the comparison mode signal CM270 may instruct the correction unit UNIT_270 to operate in the normal mode, the variable power supply 15 may generate the first reference signal and input the first reference signal to the '+' input terminal of the comparator 16. On the other hand, when the comparison mode signal CM270 may instruct the correction unit UNIT_270 to operate in the comparison mode, the variable power supply 15 supply may generate the second reference signal and output the second reference signal to the '+' input terminal of the comparator 16.

In the switch 17, any one of the switches may be turned on based on the content of the comparison mode signal CM270 from the wrapper circuit 20. When the comparison mode signal CM270 may instruct the correction unit UNIT_270 to operate in the normal mode, since the switch 17A may be turned on, the comparator 16 may output the skew adjustment signal SA_270 to the correction circuit 11. When the comparison mode signal CM270 may instruct the correction unit UNIT_270 to operate in the comparison mode and instruct duty correction for the clock CLK_180, since the switch 17B may be turned on, the comparator 16 may output the correction completion signal CD2 to the wrapper circuit 20. Further, when the comparison mode signal CM270 may instruct the correction unit UNIT_270 to operate in the comparison mode and instruct duty correction for the clock 90, since the switch 17C may be turned on, the comparator 16 may output the correction completion signal CD3 to the wrapper circuit 20.

In the duty correction of the clock CLK_180 performed using the correction units UNIT_180 and UNIT_270 configured as explained above, the comparison mode signal CM270 for instructing the correction unit UNIT_270 to operate in the comparison mode and instructing duty correction for the clock CLK_180 may be output from the wrapper circuit 20 to the correction unit UNIT_270. Thus, the switch 13B in the switch 13 may be turned on and the switch 17B in the switch 17 may be turned on. The variable power supply 15 may generate the second reference potential and output the second reference signal to the input terminal of the comparator 16.

By way of the above, the integration circuit 14 of the correction unit UNIT_270 may receive the output clock OUT_180, integrate the output clock OUT_180 and generate a smoothed voltage signal, and output the voltage signal to the '−' input terminal of the comparator 16.

While comparison of the voltage signal generated by the integration circuit 14 and the second reference signal may be performed in the comparator 16, the wrapper circuit 20 may change a value of the duty control signal DUTY_180 output to the correction circuit 11 of the correction unit UNIT_180. Consequently, the duty of the output clock OUT_180 may change.

When the duty of the output clock OUT_180 may reach the value of 50%, since the voltage signal from the integration circuit 14 and the second reference signal may coincide with each other, the comparator 16 may output the correction completion signal CD2 indicating that the duty correction of the clock CLK_180 is completed to the wrapper circuit 20. Thus, the wrapper circuit 20 may fix a value of the duty control signal DUTY_180, output the duty control signal DUTY_180 to the correction circuit 11 of the correction unit UNIT_180, and maintain the duty of the output clock OUT_180 at 50%. Consequently, the duty correction of the clock CLK_180 using the digital control may be completed.

Figure 5C:
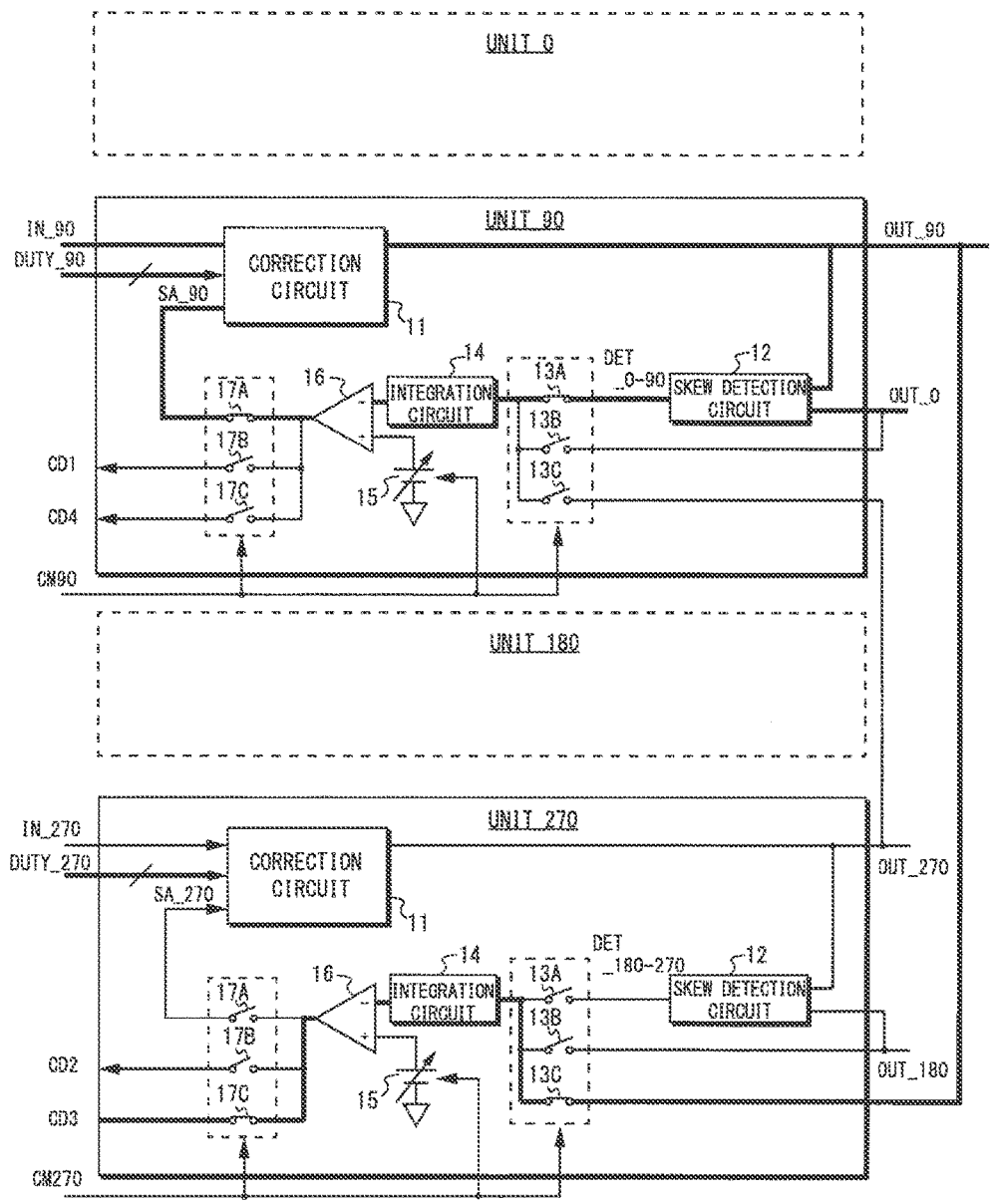
FIG. 5C is a block diagram for illustrating duty correction and skew adjustment of a clock CLK_90 in a multiphase clock correction device according to an embodiment of the invention.

FIG. 5C is a diagram for illustrating a duty correction and skew adjustment example of the clock CLK_90 in the multiphase clock correction device according to one embodiment of the invention. In the figure, for convenience, the configurations of the correction units UNIT_90 and UNIT_270 are shown.

Firstly, the duty correction of the clock CLK_90 is explained. In the duty correction of the clock CLK_90, first, the comparison mode signal CM270 for instructing the correction unit UNIT_270 to operate in the comparison mode and instructing duty correction for the clock CLK_90 may be output from the wrapper circuit 20 to the correction unit UNIT_270. Thus, the switch 13C in the switch 13 may be turned on and the switch 17C in the switch 17 may be turned on. The variable power supply 15 may generate the second reference potential and output the second reference signal to the '+' input terminal of the comparator 16.

By way of the above, the integration circuit 14 of the correction unit UNIT_270 may receive the output clock OUT_90, integrate the output clock OUT_90 and generate a smoothed voltage signal, and output the voltage signal to the '−' input terminal of the comparator 16.

When the comparison of the voltage signal generated by the integration circuit 14 and the second reference signal may be performed in the comparator 16, the wrapper circuit 20 may change a value of the duty control signal DUTY_90 output to the correction circuit 11 of the correction unit UNIT_90. Thus, duty of the output clock OUT_90 may change.

When the duty of the output clock OUT_90 may reach the setting value of 50%, since the voltage signal from the integration circuit 14 and the second reference signal coincide with each other, the comparator 16 may output the correction completion signal CD3 indicating that the duty correction of the clock CLK_90 is completed to the wrapper circuit 20. Thus, the wrapper circuit 20 may fix a value of the duty control signal DUTY_90, output the duty control signal DUTY_90 to the correction circuit 11 of the correction unit UNIT_90, and maintain the duty of the output clock OUT_90 at 50%. Consequently, the duty correction of the clock CLK_90 using the digital control may be completed.

Skew adjustment of the clock CLK_90 will next be explained below. In the skew adjustment of the clock CLK_90, first, the comparison mode signal CM90 for instructing the correction unit UNIT_90 to operate in the normal mode may be output from the wrapper circuit 20 to the correction unit UNIT_90. Thus, the switch 13A in the switch 13 may be turned on and the switch 17A in the switch 17 may be turned on. The variable power supply 15 may generate the first reference signal and output the first reference potential to the '+' input terminal of the comparator 16.

By way of the above, the integration circuit 14 of the correction unit UNIT_90 may receive the detection signal DET_0-90 generated by the skew detection circuit 12, integrate the detection signal DEL_0-90 and generate a smoothed voltage signal, and output the voltage signal to the '−' input terminal of the comparator 16.

When a phase difference of the output clock OUT_90 with respect to the output clock OUT_0 may be ideally 90 degrees, duty of the detection signal DET_0-90 generated by the skew detection circuit 12 may be 25%. Accordingly, when the phase difference of the output clock OUT_90 with respect to the output clock OUT_0 may be an ideal value, the potential of the voltage signal generated by the integration circuit 14 may be ¼vdd. Thus, the first reference signal generated by the variable power supply 15 may be set to ¼vdd. Comparison of the voltage signal generated by the integration circuit 14 and the first reference signal may be performed in the comparator 16. The comparator 16 may output the comparison result to the correction circuit 11 as the skew adjustment signal SA. Therefore, an analog negative feedback loop may be constructed.

In the correction circuit 11, in accordance with a change of a value of the skew adjustment signal SA, a value of the electric current output to the inverter 116 as the power supply current by the drain terminal of the transistor 112 and a value of the electric current output to the inverter 116 as the power supply current by the drain terminals of the transistors 114 may simultaneously change. Therefore, the phase of the output clock OUT_90 may change as explained with reference to FIG. 4B. Since the analog negative feedback loop may be constructed as explained above, the output clock OUT_90 may be subjected to skew adjustment using analog control. A phase difference with respect to the output clock OUT_0 may be adjusted to the ideal value of 90 degrees.

It is noted that the skew adjustment of the output clock OUT_90 may be able to be performed simultaneously with the duty correction of the output clock OUT_90. The skew adjustment of the output clock OUT_90 may be able to be performed simultaneously with the duty correction of the clock CLK_180 as well.

Figure 5D:
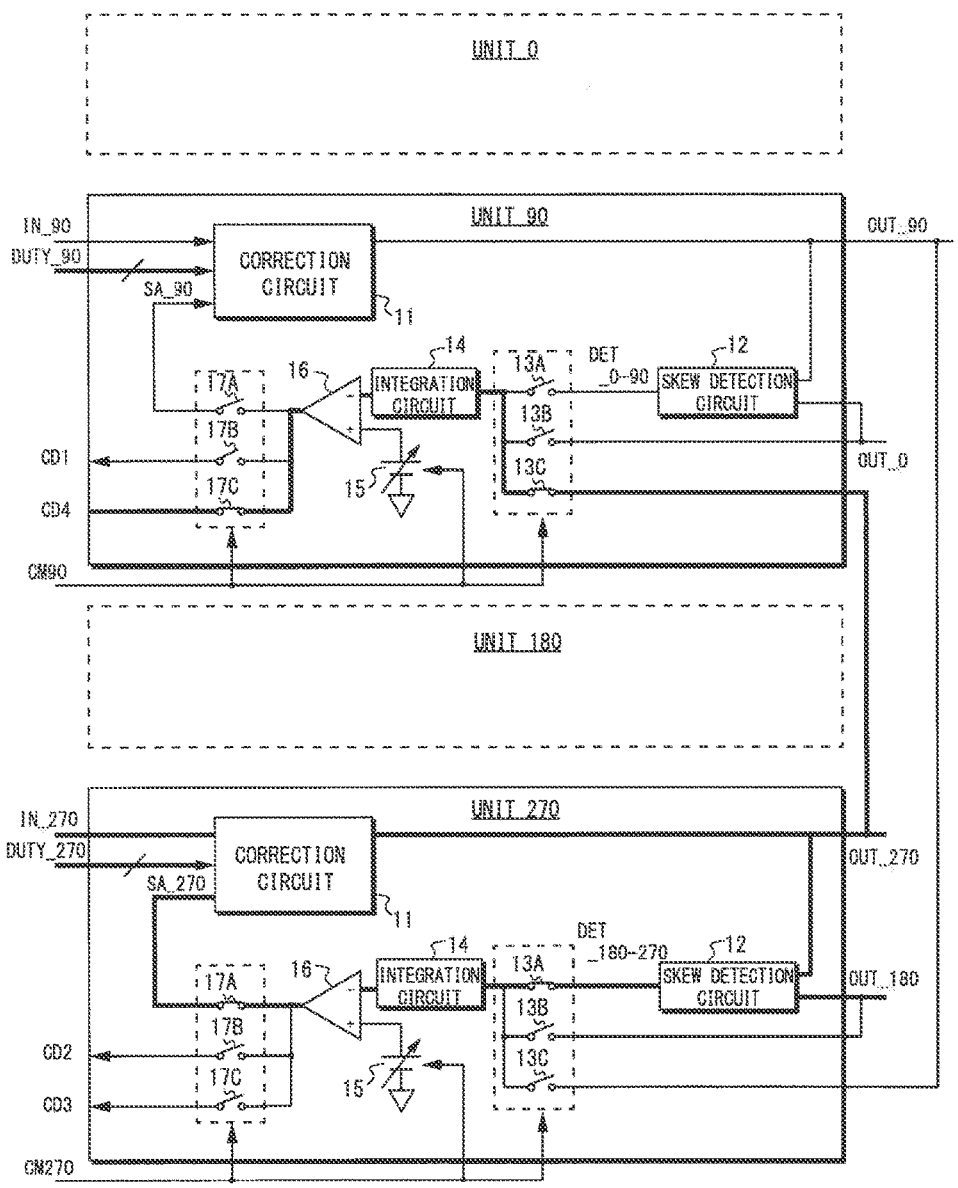
FIG. 5D is a block diagram for illustrating duty correction and skew adjustment of a clock CLK_270 in a multiphase clock correction device according to an embodiment of the invention.

FIG. 5D is a diagram for illustrating a duty correction and skew adjustment example in the multiphase clock correction device according to one embodiment of the invention. In the figure, for convenience, the configurations of only the correction units UNIT_270 and UNIT_90 are shown.

Firstly, the duty correction of the clock CLK_270 is explained. In the duty correction of the clock CLK_270, first, the comparison mode signal CM90 for instructing the correction unit UNIT_90 to operate in the comparison mode and instructing the duty correction for the clock CLK_270 may be output from the wrapper circuit 20 to the correction unit UNIT_90. Thus, the switch 13C in the switch 13 may be turned on and the switch 17C in the switch 17 may be turned on. The variable power supply 15 may generate the second reference potential and output the second reference signal to the '+' input terminal of the comparator 16.

By way of the above, the integration circuit 14 of the correction unit UNIT_90 may receive the output clock OUT_270, integrate the output clock OUT_270 and generate a smoothed voltage signal, and output the voltage signal to the '−' input terminal of the comparator 16.

When comparison of the voltage signal generated by the integration circuit 14 and the second reference signal may be performed in the comparator 16, the wrapper circuit 20 may change a value of the duty control signal DUTY_270 sent to the correction circuit 11 of the correction unit UNIT_270. Consequently, duty of the output clock OUT_270 may change.

When the duty of the output clock OUT_270 may reach the setting value of 50%, the voltage signal from the integration circuit 14 and the second reference signal may coincide with each other. Therefore, the comparator 16 may output the correction completion signal CD4 indicating that the duty correction of the clock CLK_270 is completed to the wrapper circuit 20. Thus, the wrapper circuit 20 may fix a value of the duty control signal DUTY_270, send the duty control signal DUTY_270 to the correction circuit 11 of the correction unit UNIT_270, and maintain the duty of the output clock OUT_270 at 50%. Consequently, the duty correction of the clock CLK_270 using the digital control may be completed.

Skew adjustment of the clock CLK_270 will next be explained below. In the skew adjustment of the clock CLK_270, the comparison mode signal CM270 for instructing the correction unit UNIT_270 to operate in the normal mode may be output from the wrapper circuit 20 to the correction unit UNIT_270. Thus, the switch 13A in the switch 13 may be turned on and the switch 17A in the switch 17 may be turned on. The variable power supply 15 may generate the first reference signal and output the first reference potential to the '+' input terminal of the comparator 16.

By way of the above, the integration circuit 14 of the correction unit UNIT_270 may receive the detection signal DET_180-270 generated by the skew detection circuit 12, integrate the detection signal DET_180-270 and generate a smoothed voltage signal, and output the voltage signal to the '−' input terminal of the comparator 16.

The comparator 16 may perform comparison of the voltage signal generated by the integration circuit 14 and the first reference signal and output a result of the comparison to the correction circuit 11 as the skew adjustment signal SA. Therefore, an analog negative feedback loop may be constructed.

In the correction circuit 11, the phase of the output clock OUT_270 may change according to a change of a value of the skew adjustment signal SA. Since the analog negative feedback loop may be constructed as explained above, the output clock OUT_270 may be subjected to skew adjustment using analog control. A phase difference with respect to the output clock OUT_180 may be adjusted to the ideal value of 90 degrees.

It is noted that the skew adjustment of the output clock OUT_270 may be able to be performed simultaneously with the duty correction of the output clock OUT_270 explained above. The skew adjustment of the output clock OUT_270 may be able to be performed simultaneously with the duty correction of the clock CLK_0.

FIGS. 7A to 7E are flowcharts for illustrating a multiphase clock correction method according to one embodiment of the invention. The clock correction method may be processing executed in the multiphase clock correction device 1.

Figure 7A:
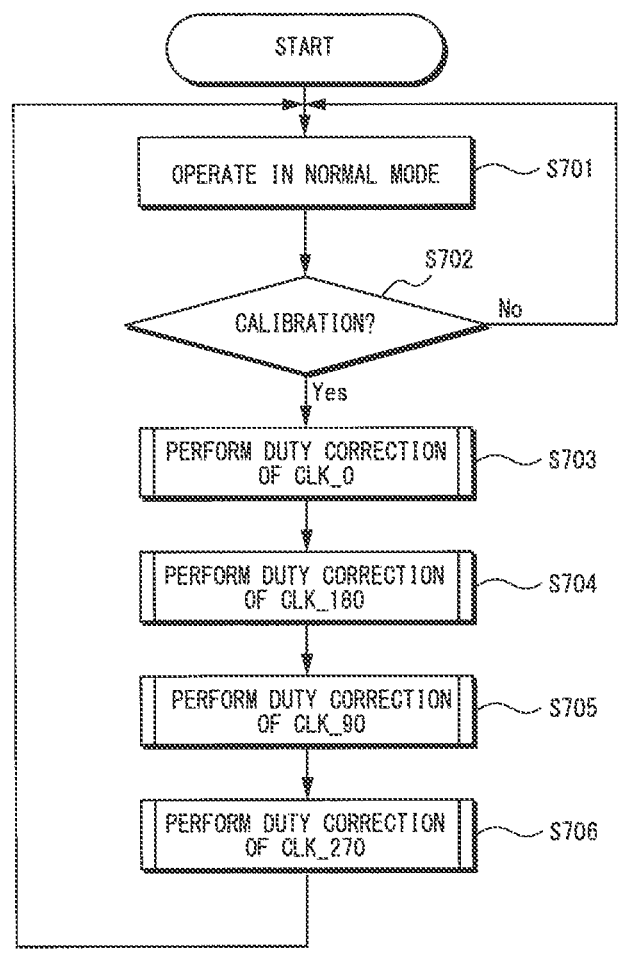
FIG. 7A is a flowchart for illustrating a multiphase clock correction method according to an embodiment of the invention.

Firstly, the wrapper circuit 20 may operate the correction processing circuit 10 in the normal mode as shown in FIG. 7A (S701). The normal mode may be a mode for performing skew adjustment of the clock CLK_90 in the correction unit UNIT_90 and performing skew adjustment of the clock CLK_270 in the correction unit UNIT_270. In this case, duty correction of the clocks CLK_0, CLK_90, CLK_180, and CLK_270 may be not performed. It is noted that the normal mode may be set by the wrapper circuit 20 outputting the comparison mode signal CM90 for instructing operation in the normal mode to the correction unit UNIT_90 and outputting the comparison mode signal CM270 for instructing operation in the normal mode to the correction unit UNIT_270.

Next, the wrapper circuit 20 may determine whether the wrapper circuit 20 is requested from a not-shown another circuit or the like to execute a calibration mode for performing duty correction of the clocks CLK_0, CLK_90, CLK_180, and CLK_270 (S702). When it may be determined that the execution of the calibration mode is not requested (No in S702), the wrapper circuit 20 may maintain the normal mode. In contrast, when it may be determined that the execution of the calibration mode is requested (Yes in S702), the wrapper circuit 20 may perform duty correction of the clock CLK_0 (S703).

Figure 7B:
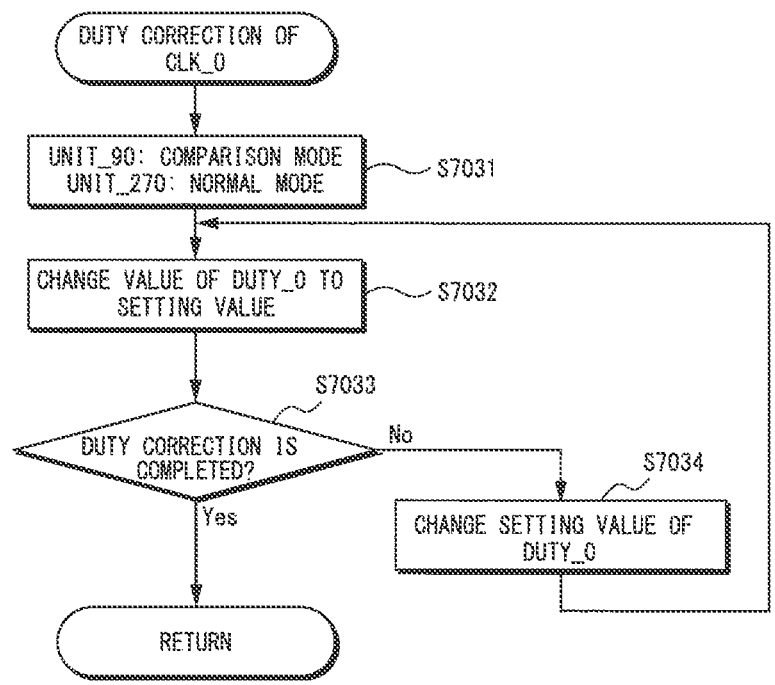
FIG. 7B is a flowchart for illustrating duty correction of a clock CLK_0 in a multiphase clock correction method according to an embodiment of the invention.

In the duty correction of the clock CLK_0, as shown in FIG. 7B, firstly, the wrapper circuit 20 may output the comparison mode signal CM90 for instructing the correction unit UNIT_90 to operate in the comparison mode and instructing duty correction for the clock CLK_0 to the correction unit UNIT_90 (S7031).

Subsequently, the wrapper circuit 20 may change a value of the duty control signal DUTY_0 output to the correction unit UNIT_0 to a setting value (S7032). Specifically, the wrapper circuit 20 may change, after the calibration mode is started, in first S7032, the value of the duty control signal DUTY_0 to a setting value set in advance and change, in second and subsequent S7032, the value to a setting value set in S7034 explained below. Then, the wrapper circuit 20 may determine whether the correction completion signal CD1 indicating completion of the duty correction of the clock CLK_0 is received from the correction unit UNIT_90 (S7033). When determining that the correction completion signal CD1 is received (Yes in S7033), the wrapper circuit 20 may end the duty correction of the clock CLK_0 and proceed to S704 in FIG. 7A. In contrast, when determining that the correction completion signal CD1 is not received (No in S7033), the wrapper circuit 20 may change the setting value of the duty control signal DUTY_0 (S7034) and return to the processing in S7032.

Figure 7C:
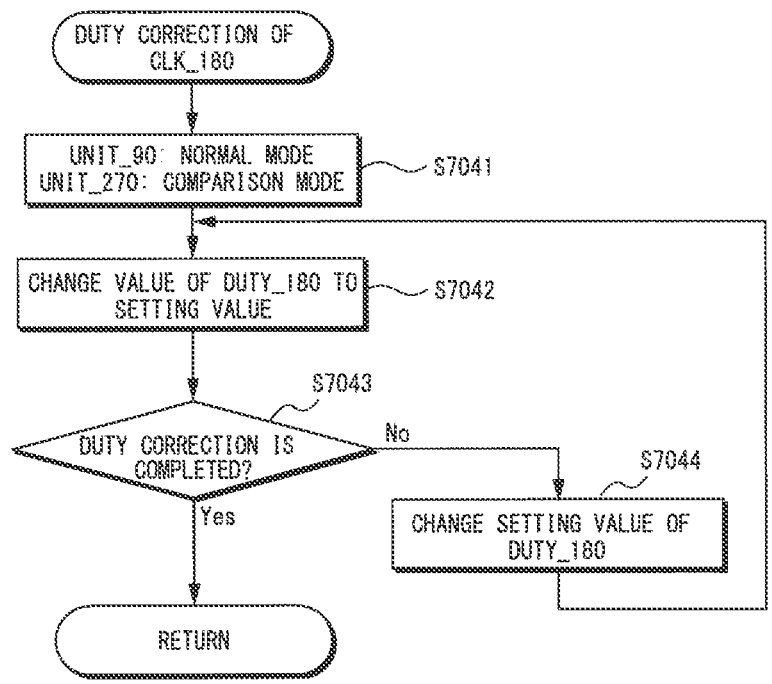
FIG. 7C is a flowchart for illustrating duty correction of a clock CLK_180 in a multiphase clock correction method according to an embodiment of the invention.

Subsequently, as shown in FIG. 7A, the wrapper circuit 20 may perform duty correction of the dock CLK_180 (S704). In the duty correction of the clock CLK_180, as shown in FIG. 7C, firstly, the wrapper circuit 20 may output the comparison mode signal CM270 for instructing the correction unit UNIT_270 to operate in the comparison mode and instructing duty correction for the dock CLK_180 to the correction unit UNIT_270 (S7041).

The wrapper circuit 20 may then change a value of the duty control signal DUTY_180 output to the correction unit UNIT_180 to a setting value (S7042). That is, the wrapper circuit 20 may change, after the calibration mode is started, in first S7042, the value of the duty control signal DUTY_180 to a setting value set in advance and change, in second and subsequent S7042, the value to a setting value set in S7044 explained below. Subsequently, the wrapper circuit 20 may determine whether the correction completion signal CD2 indicating completion of the duty correction of the clock CLK_180 is received from the correction unit UNIT_270 (S7043). When determining that the correction completion signal CD2 is received (Yes in S7043), the wrapper circuit 20 may end the duty correction of the clock CLK_180 and proceed to S705 in FIG. 7A. In contrast, when determining that the correction completion signal CD2 is not received (No in S7043), the wrapper circuit 20 may change the set value of the duty control signal DUTY_180 (S7044) and return to the processing in S7042.

Figure 7D:
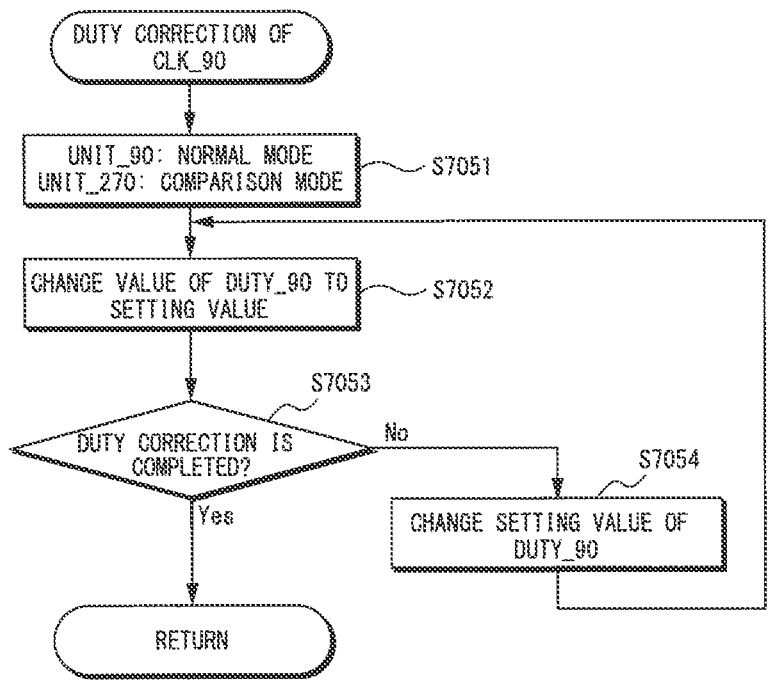
FIG. 7D is a flowchart for illustrating duty correction of a clock CLK_90 in a multiphase clock correction method according to an embodiment of the invention.

As shown in FIG. 7A, the wrapper circuit 20 may next perform duty correction of the clock CLK_90 (S705). In the duty correction of the clock CLK_90, as shown in FIG. 7D, first, the wrapper circuit 20 may output the comparison mode signal CM270 for instructing the correction unit UNIT_270 to operate in the comparison mode and instructing duty correction for the clock CLK_90 to the correction unit UNIT_270 (S7051). In this case, the comparison mode signal CM90 may remain instructing the correction unit UNIT_90 to operate in the normal mode. Therefore, in the correction unit UNIT_90, the skew adjustment of the clock CLK_90 may be continued.

Further, the wrapper circuit 20 may change a value of the duty control signal DUTY_90 output to the correction unit UNIT_90 to a setting value (S7052). That is, the wrapper circuit 20 may change, after the calibration mode is started, in first S7052, the value of the duty control signal DUTY_90 to a setting value set in advance and change, in second and subsequent S7052, the value to a setting value set in S7054 explained below. The wrapper circuit 20 may determine whether the correction completion signal CD3 indicating completion of the duty correction of the clock CLK_90 is received from the correction unit UNIT_270 (S7053). When determining that the correction completion signal CD3 is received (Yes in S7053), the wrapper circuit 20 may end the duty correction of the clock CLK_90 and proceed to S706 in FIG. 7A. In contrast, when determining that the correction completion signal CD3 is not received (No in S7053), the wrapper circuit 20 may change the set value of the duty control signal DUTY_90 (S7054) and return to the processing in S7052.

Figure 7E:
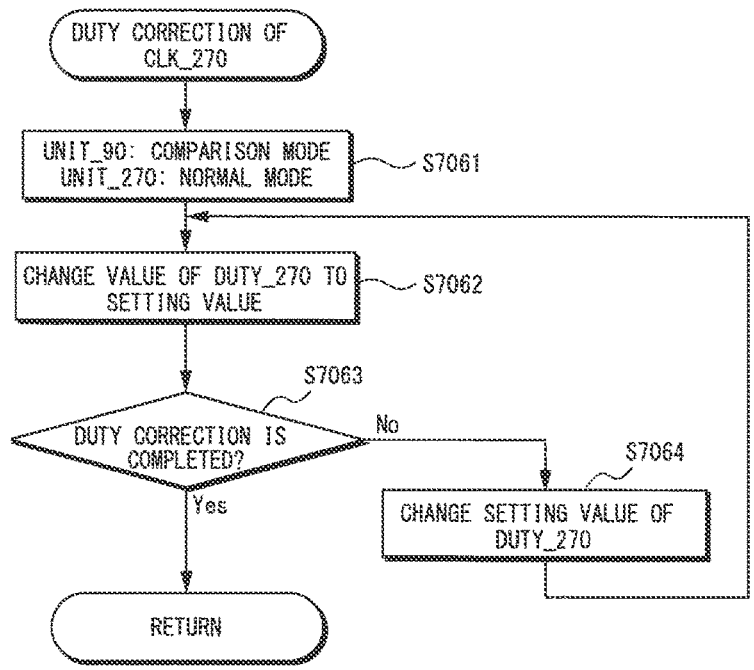
FIG. 7E is a flowchart for illustrating duty correction of a clock CLK_270 in a multiphase clock correction method according to an embodiment of the invention.

Subsequently, as shown in FIG. 7A, the wrapper circuit 20 may perform duty correction of the clock CLK_270 (S706). In the duty correction of the clock CLK_270, as shown in FIG. 7E, first, the wrapper circuit 20 may output the comparison mode signal CM270 for instructing the correction unit UNIT_270 to operate in the normal mode to the correction unit UNIT_270 and output the comparison mode signal CM90 for instructing the correction unit UNIT_90 to operate in the comparison mode and instructing duty correction for the clock CLK_270 to the correction unit UNIT_90 (S7061). By way of this, in the correction unit UNIT_270, skew adjustment of the clock CLK_270 may also be executed.

Further, the wrapper circuit 20 may change a value of the duty control signal DUTY_270 output to the correction unit UNIT_270 to a setting value (S7062). That is, the wrapper circuit 20 may change, after the calibration mode is started, in first S7062, the value of the duty control signal DUTY_270 to a setting value set in advance and change, in second and subsequent S7062, the value to a setting value set in S7064 explained below. The wrapper circuit 20 may determine whether the correction completion signal CD4 indicating completion of the duty correction of the clock CLK_270 is received from the correction unit UNIT_90 (S706). When determining that the correction completion signal CD4 is received (Yes in S7063), the wrapper circuit 20 may return to S701 in FIG. 7A and operate the correction processing circuit 10 in the normal mode. In contrast, when determining that the correction completion signal CD4 is not received (No in S7063), the wrapper circuit 20 may change the set value of the duty control signal DUTY_270 (S7064) and return to the processing in S7062.

Figure 8:
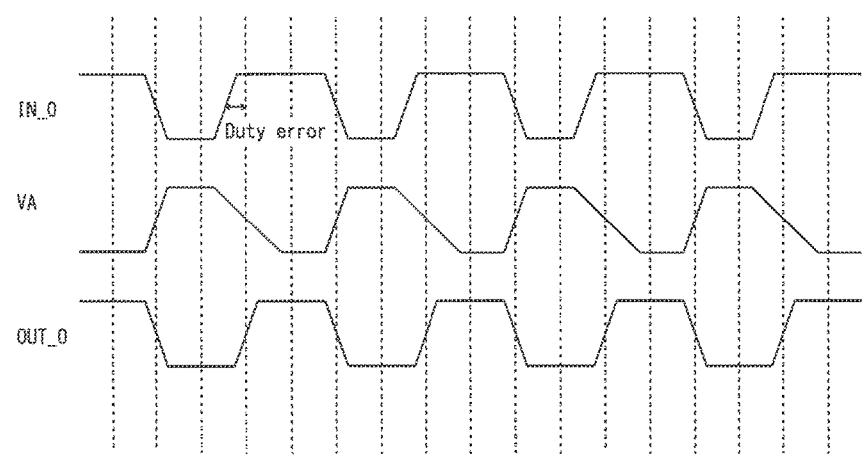
FIG. 8 is a diagram showing waveforms for illustrating an example of duty correction by the multiphase clock correction device according to an embodiment of the invention.

FIG. 8 is a diagram showing waveforms of places for illustrating a duty correction example in the multiphase clock correction device according to the embodiment of the present invention. In the figure, in order to explain a duty correction example of the clock CLK_0, the input clock IN_0, the internal adjusted waveform VA, and the output clock OUT_0 in the correction unit UNIT_0 are shown.

In the figure, a duty error may occur in the input clock IN_0. The input clock IN_0 may have duty exceeding the set value of 50%.

Therefore, the multiphase clock correction device 1 may change the value of the duty control signal DUTY_0 output from the wrapper circuit 20 to the correction unit UNIT_0 to change a falling edge of the internal adjusted waveform VA in the correction unit UNIT_0 to a desired tilt as shown in the figure. The multiphase dock correction device 1 may invert the internal adjustment waveform VA in the correction unit UNIT_0 and output the output dock OUT_0 subjected to duty correction.

Figure 9A:
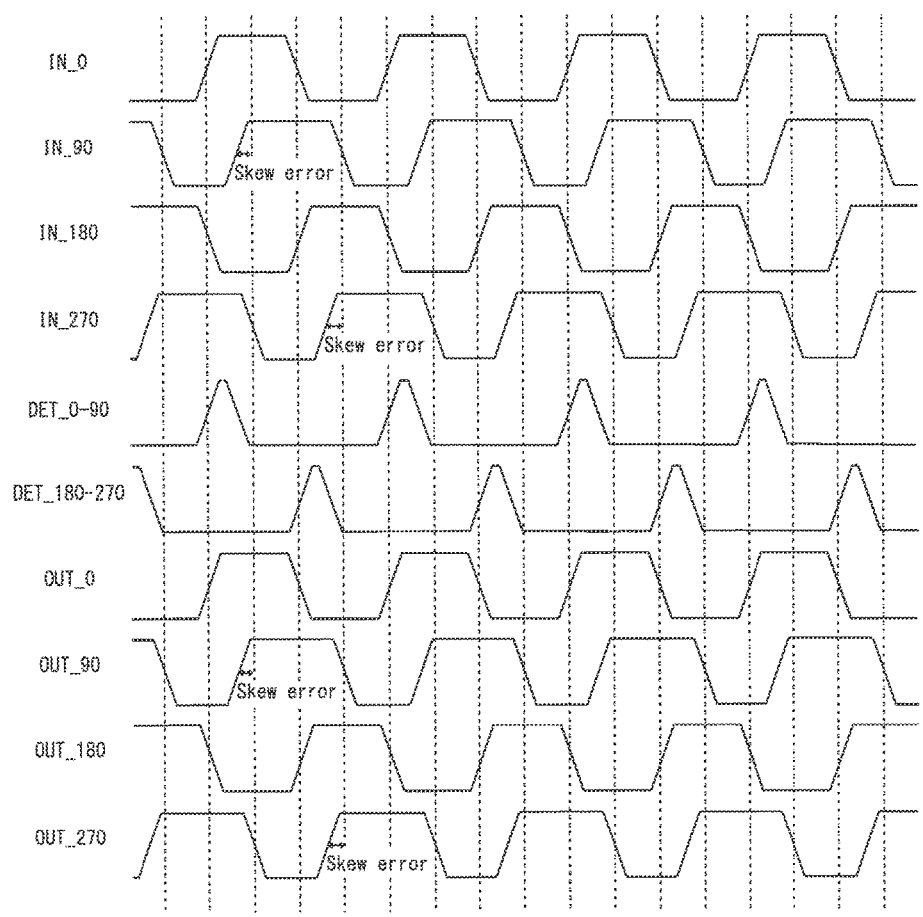
FIG. 9A is a diagram showing waveforms before skew adjustment of the invention is performed.
Figure 9B:
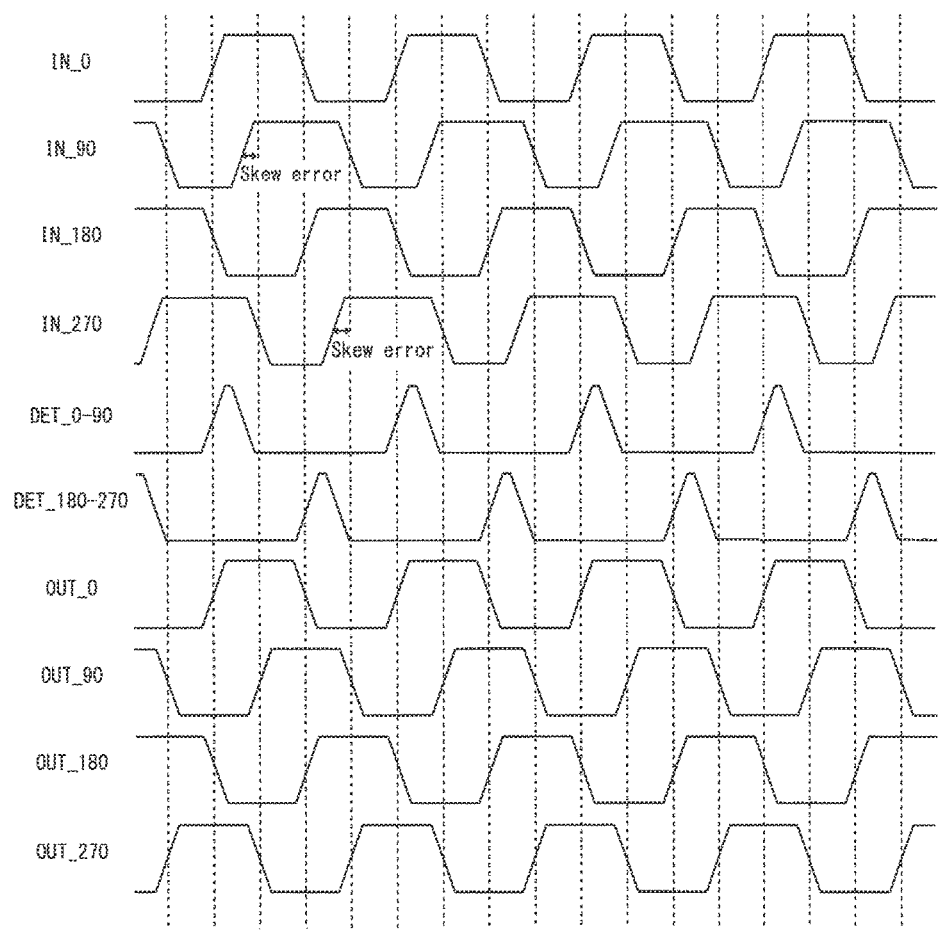
FIG. 9B is a diagram showing waveforms for illustrating an example of skew adjustment by a multiphase clock correction device according to an embodiment of the invention.

FIGS. 9A and 9B are diagrams showing waveforms for illustrating an example of skew adjustment in the multiphase clock correction device according to one embodiment of the invention. Specifically, FIG. 9A shows the waveforms obtained when the correction according to the present invention is not performed, whereas FIG. 9B shows the waveforms obtained the correction according to the present invention is performed. In the figures, in order to explain an example of skew adjustment of the clock CLK_90 and the clock CLK_270, the input clock IN_0 and the output clock OUT_0 in the correction unit UNIT_0, the input clock IN_90 and the output dock OUT_90 in the correction unit UNIT_90, the input dock IN_180 and the output clock OUT_180 in the correction unit UNIT_180, the input clock IN_270 and the output clock OUT_270 in the correction unit UNIT_270 are shown. In addition, in the figures, the detection signal DET_0-90 output from the skew detection circuit 12 of the correction unit UNIT_270 and the detection signal DET_180-270 output from the skew detection circuit 12 of the correction unit UNIT_90 are shown.

In both the figures, a phase difference between the input clock IN_0 and the input clock IN_90 may be smaller than 90 degrees and a skew error may have occurred. The detection signal DET_0-90 in this state may have duty equal to or smaller than 25% as shown in FIG. 9A.

Therefore, in the correction unit UNIT_90, the multiphase clock correction device 1 may generate the skew adjustment signal SA based on the detection signal DET_0-90 and send the skew adjustment signal SA to the correction circuit 11 to perform analog negative feedback control. Consequently, the multiphase clock correction device 1 may perform skew adjustment of the output clock OUT_90 and set the phase difference between the output clock OUT_0 and the clock CLK_90 to 90 degrees as shown in FIG. 9B.

As shown in FIG. 9A, a phase difference between the input clock IN_180 and the input clock IN_270 may also be smaller than 90 degrees and a skew error may have occurred. The detection signal DET_180-270 in this state may have duty equal to or smaller than 25% as shown in FIG. 9A.

Therefore, in the correction unit UNIT_270, the multiphase clock correction device 1 may generate the skew adjustment signal SA based on the detection signal DET_180-270 and send the skew adjustment signal SA to the correction circuit 11 to perform analog negative feedback control. Thus, the multiphase clock correction device 1 may perform skew adjustment of the output clock OUT_270 and set the phase difference between the output clock OUT_180 and the clock CLK_270 to 90 degrees as shown in FIG. 9B.

The embodiments are examples for illustrating the invention and do not mean to limit the invention to the embodiments. The invention can be carried out in various forms without departing from the spirit of the present invention.

For example, in the method disclosed in this specification, steps, acts, or functions may be carried out in parallel or in different order as long as no contradiction occurs in a result of the method. The explained steps, acts, and functions are provided as mere examples. Several steps, acts, and functions among the steps, the acts, and the functions can be omitted or may be combined with one another as one step, one act, and one function, or other steps, acts, or functions may be added without departing from the spirit of the invention.

The multiphase clocks for performing the skew adjustment and the duty correction are not limited to the four phase clocks by the multiphase clock correction device 1. In the multiphase clock correction device 1, the skew adjustment and the duty correction of a larger number of phases of clocks can be performed by adding correction units UNIT as appropriate. In this case, the first reference signal generated by the variable power supply 15 may be changed in accordance with the number of phases of the multiphase clocks.

In this specification, various embodiments are disclosed. A specific feature or technical matter in one embodiment can be added to another embodiment or substituted with a specific feature in the other embodiment while being improved as appropriate. Such a form is also included in the gist of the present invention.

The present invention can be widely used in the field of a semiconductor integrated circuit.

What is claimed is:

1. A clock correction device comprising:
   a correction circuit that performs, in a first mode, skew adjustment of an input clock under analog control using a skew adjustment signal based on a phase difference between an output clock and a reference clock and that receives, in a second mode, a duty control signal and performs duty correction of the input clock under digital control;
   a skew detection circuit that outputs a detection signal being in a predetermined state;
   an integration circuit that integrates a selected signal and generates a voltage signal, the selected signal being either the detection signal or the output clock; and
   a comparator that compares the voltage signal and a predetermined reference signal,
   wherein, in the first mode, the skew detection circuit outputs the detection signal when the output clock and the reference clock are input and only the reference clock is in the predetermined state, the integration circuit integrates the detection signal and generates a first voltage signal, and the comparator compares the first voltage signal and a first reference signal and generates the skew adjustment signal, and
   wherein, in the second mode, the integration circuit integrates the output clock and generates a second voltage signal instead of the detection signal, and the comparator compares the second voltage signal and a second reference signal instead of comparing the first voltage signal and the first reference signal and generates a correction completion signal.

2. The clock correction device according to claim 1, further comprising a wrapper circuit,
wherein the integration circuit integrates the output clock and generates the second voltage signal on the basis of an instruction from the wrapper circuit, and
wherein the wrapper circuit changes a value of the duty control signal until the correction completion signal reaches a predetermined value.

3. A multiphase clock correction device that performs skew adjustment and duty correction of multiphase clocks having a predetermined phase difference from one another, the multiphase clock correction device comprising:
a plurality of correction circuits operably connected in multiple stages, wherein at least one of the plurality of correction circuits performs, in a first mode, skew adjustment of an input clock under analog control using a skew adjustment signal based on a phase difference between an output clock and a reference clock, and receives, in a second mode, a duty control signal and performs duty correction of the input clock under digital control;
a skew detection circuit that outputs a detection signal being in a predetermined state;
an integration circuit that integrates a selected signal and generates a voltage signal, the selected signal being either the detection signal or the output clock; and
a comparator that compares the voltage signal and a predetermined reference signal,
wherein, in the first mode, the skew detection circuit outputs the detection signal when the output clock of one correction circuit among the plurality of correction circuits and the output clock, regarded as the reference clock, of the correction circuit at a preceding-stage of the one correction circuit are input and only the reference clock is in the predetermined state, the integration circuit integrates the detection signal and generates a first voltage signal, and the comparator compares the first voltage signal and a first reference signal and generates the skew adjustment signal,
wherein, in the second mode, the integration circuit integrates the output clock of the correction circuit at a predetermined stage among the plurality of correction circuits and generates a second voltage signal instead of the detection signal, and the comparator compares the second voltage signal and a second reference signal instead of comparing the first voltage signal and the first reference signal and generates a correction completion signal of the correction circuit at the predetermined stage.

4. The multiphase clock correction device according to claim 3, further comprising a wrapper circuit,
wherein the wrapper circuit selects one of the first mode and the second mode,
wherein, in the second mode, the integration circuit integrates the output clock of the correction circuit at the predetermined stage and generates the second voltage signal based on an instruction from the wrapper circuit, and
wherein the wrapper circuit changes a value of the duty control signal of the correction circuit at the predetermined stage until the correction completion signal of the correction circuit at the predetermined stage reaches a predetermined value.

5. A multiphase clock correction method in a multiphase clock correction circuit including a plurality of correction circuits operably connected in multiple stages, the method comprising:
in a first mode, adjusting skew of an input clock under analog control using a skew adjustment signal based on a phase difference between an output clock and a reference clock; and
in a second mode, receiving a duty control signal and correcting duty of the input clock under digital control based on the received duty control signal,
wherein the adjusting the skew includes:
outputs, when the output clock of one correction circuit among the plurality of correction circuits and the output clock, regarded as the reference clock, of the correction circuit at a preceding-stage of the one correction circuit to be the reference clock are input and only the reference clock is in a predetermined state, a detection signal being the predetermined state;
integrating the detection signal and generating a first voltage signal; and
comparing the first voltage signal and a first reference signal and generating the skew adjustment signal of the one correction circuit,
wherein the correcting the duty includes:
integrating the output clock of one correction circuit at a predetermined stage among the plurality of correction circuits, and generating a second voltage signal; and
comparing the second voltage signal and a second reference signal, and generating a correction completion signal of the correction circuit at the predetermined stage.

6. The multiphase clock correction method according to claim 5, wherein the correcting the duty further includes changing a value of the duty control signal of the correction circuit at the predetermined stage until the correction completion signal of the correction circuit at the predetermined stage reaches a predetermined value.

* * * * *